United States Patent
Lind

(10) Patent No.: US 7,068,103 B2
(45) Date of Patent: Jun. 27, 2006

(54) OPERATIONAL TRANSCONDUCTANCE AMPLIFIER INPUT DRIVER FOR CLASS D AUDIO AMPLIFIERS

(75) Inventor: Ryan E. Lind, Jackson, MS (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/836,067

(22) Filed: Apr. 30, 2004

(65) Prior Publication Data

US 2005/0242874 A1    Nov. 3, 2005

(51) Int. Cl.
*H03F 3/217* (2006.01)
(52) U.S. Cl. .................. 330/251; 330/253
(58) Field of Classification Search ............ 330/207 A, 330/251, 252, 307, 277, 253, 260, 250, 10, 330/254, 255; 327/307, 336, 337
See application file for complete search history.

(56) References Cited

U.S. PATENT DOCUMENTS 3,530,395 A * 9/1970 Prusha ................ 330/69

(Continued)

OTHER PUBLICATIONS

Pierce, et al., Applied Electronics (Bell & Howell, 1991). p. 448, no month.

"Data Sheet: TDA8922 2×25W class-D power amplifier" (Philips Semiconductors; Mar. 23, 2003).
"Data Sheet: TDA8920 2×80W class-D power amplifier" (Philips Semiconductors; Sep. 25, 2002).
Geiger et al., "Active Filter Design Using Operational Transconductance Amplifiers: A Tutorial", Circuits and Devices Magazine (IEEE, Mar. 1985). pp. 20-32.
Grise, "Application of the Operational Transconductance Amplifier to Voltage-controlled Amplifiers and Active Filters", et.nmsu.edu/-etti/winter98/electronics/grise/wrg.html, no date.

*Primary Examiner*—Linh V. Nguyen
(74) *Attorney, Agent, or Firm*—W. James Brady, III; Frederick J. Telecky, Jr.

(57) ABSTRACT

An audio preamplifier (10) based on an operational transconductance amplifier, in combination with a class D audio output amplifier (12) is disclosed. The input signal is coupled to the preamplifier (10) through a capacitor (14) in series with a resistor (17) that sets the transconductance of the preamplifier. The preamplifier (10) includes a differential operational amplifier (20) that drives output MOS transistors (22*a*, 22*b*), which are biased by current sources (24*a*, 26*a*; 24*b*, 26*b*). Feedback from the drain nodes of the output MOS transistors (22*a*, 22*b*) to the inputs of the differential operational amplifier (20), along with the series capacitor (14) and resistor (17) input coupling, ensures minimum offset voltage and current at the output of the preamplifier (10). Common mode feedback control amplifiers (25, 29) ensure proper bias of the components into the saturation region.

21 Claims, 6 Drawing Sheets

U.S. PATENT DOCUMENTS

| | | | |
|---|---|---|---|
| 5,594,386 A * | 1/1997 | Dhuyvetter | 330/251 |
| 5,642,070 A * | 6/1997 | Furukawa | 327/354 |
| 5,642,076 A * | 6/1997 | Naokawa et al. | 330/149 |
| 5,838,807 A * | 11/1998 | Andersson et al. | 381/321 |
| 6,118,336 A * | 9/2000 | Pullen et al. | 330/10 |
| 6,127,885 A * | 10/2000 | Colangelo | 330/10 |
| 6,144,256 A * | 11/2000 | Barbetta | 330/255 |
| 6,166,596 A * | 12/2000 | Higashiyama et al. | 330/10 |
| 6,448,851 B1 * | 9/2002 | McIntosh et al. | 330/207 A |
| 6,563,377 B1 * | 5/2003 | Butler | 330/10 |
| 6,707,337 B1 * | 3/2004 | Noro | 330/10 |
| 6,762,645 B1 * | 7/2004 | Grant | 330/251 |
| 6,952,131 B1 * | 10/2005 | Jeong et al. | 330/10 |

* cited by examiner

OPERATIONAL TRANSCONDUCTANCE AMPLIFIER INPUT DRIVER FOR CLASS D AUDIO AMPLIFIERS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of audio amplifiers, and is more specifically directed to pre-amplifier circuits for pulse-width modulated class D audio power amplifiers.

As is fundamental in the art, electronic amplifier circuits are often classified in various "classes". For example, the output drive transistors of class A amplifier circuits conduct DC current even with no audio signal, and the entire output voltage swing is of a single polarity. A class B amplifier, on the other hand, typically includes complementary output drive transistors, driving an output voltage swing including both positive and negative polarity excursions. Class B amplifiers are necessarily more efficient, because both complementary output drive transistors are never on at the same time. Class AB amplifiers maintain a small bias current through complementary output drive transistors, so that the output voltage swing is centered slightly above (or below) ground voltage. While the non-zero bias current renders class AB amplifiers theoretically less efficient than class B amplifiers, class AB amplifiers present avoid the crossover distortion of class B amplifiers.

In recent years, digital signal processing techniques have become prevalent in many electronic systems. The fidelity provided by digital techniques has increased dramatically with the switching speed of digital circuits. In audio applications, the switching rates of modern digital signal processing are sufficiently fast that digital techniques have become accepted for audio electronic applications, even by many of the fussiest "audiophiles".

Digital techniques for audio signal processing now extend to the driving of the audio output amplifiers. A new class of amplifier circuits has now become popular in many audio applications, namely "class D" amplifiers. Class D amplifiers drive a complementary output signal that is digital in nature, with the output voltage swinging fully from "rail-to-rail" at a duty cycle that varies with the audio information. Complementary metal-oxide-semiconductor (CMOS) output drive transistors are thus suitable for class D amplifiers, as such devices are capable of high, full-rail, switching rates such as desired for digital applications. As known in the art, CMOS drivers conduct extremely low DC current, and their resulting efficiency is especially beneficial in portable and automotive audio applications, and also small form factor systems such as flat-panel LCD or plasma televisions. In addition, the ability to realize the audio output amplifier in CMOS enables integration of an audio output amplifier with other circuitry in the audio system, further improving efficiency and also reducing manufacturing cost of the system. This integration also provides performance benefits resulting from close device matching between the output devices and the upstream circuits, and from reduced signal attenuation.

In recent years, single-hip audio amplifier systems now integrate the audio output amplifier with conventional pre-amplifier circuits. Such integration not only provides the benefits mentioned above, but also facilitates closed-loop circuit techniques for reducing harmonic distortion. Integration of the audio output amplifier with the preamplifier also enables the system designer to further miniaturize the end system.

FIG. 1 illustrates a conventional class D audio output amplifier and preamplifier architecture, such as may be realized in a single integrated circuit. Input voltage $V_{in}$ is a differential signal, such as may be generated by an upstream codec or other signal processing function. DC blocking capacitors 3 capacitively couple the differential input signal $V_{in}$ to the inputs of differential preamplifier 5. Preamplifier 5, in this conventional architecture, is realized by relatively low-voltage devices, at least relative to the class D power amplifier stage 11.

Power amplifier stage 11 is a conventional class D power amplifier, applying a fixed gain (e.g., a gain of five). In this conventional example, the differential output of preamplifier 5 is coupled, through resistors $R_i$, to differential inputs of integrating amplifier 7. The differential output of integrating amplifier 7 is applied to the differential input of pulse-width modulating (PWM) amplifier 9, which drives its differential output at a PWM output voltage $V_{out}$, in class D fashion. Feedback resistors $R_f$ couple the output of PWM amplifier 9 back to the differential input to integrating amplifier 7.

While this conventional preamplifier and amplifier arrangement of FIG. 1 has been well-accepted in the industry, it inherently boosts any noise and offset voltage that appears at the output of preamplifier 5. In this example:

$$V_{out} = (V_n + V_{os}) \cdot \left(1 + \frac{R_f}{R_i}\right) \quad (1)$$

where $V_n$ and $V_{os}$ are the noise and offset voltages, respectively, at the input to integrating amplifier 7. In this case, if the gain of power amplifier stage 11 is five $$\left(\frac{R_f}{R_i} = 5\right),$$

then the noise and offset voltages are boosted by a factor of six at output voltage $V_{out}$. An offset voltage of 5 mV thus results in an output offset voltage of 30 mV. This offset boost results in increased bias current at the audio output, a higher noise floor, and louder "popping" as the amplifier is turned on.

One could reduce the effect of the noise and offset voltage by "chopping" the integrating amplifier, so that the boosting effects are moved out of the audio frequency band. However, this is impractical due to the very large slew rate required to charge and discharge these large capacitors in handling high amplitude voltage swings.

By way of further background, a circuit referred to as the operational transconductance amplifier (OTA) is well known in the art. OTAs are operational amplifiers that receive an input voltage and produce an output current, thus serving as a voltage-controlled current source. The transconductance parameter can be controlled by the bias current in the differential input pair or by a resistor (or both), and very high input and output impedances are presented by the OTA. An example of a feedback OTA circuit is shown in Pierce, et al., *Applied Electronics* (Bell & Howell, 1991). p. 448.

Conventional OTA architectures as applied to audio preamplification have been proposed. It has been observed, in connection with this invention, that many of these OTA approaches contribute to significant DC offset voltages at the output of the amplifier. For example, the TDA8922 class D power amplifier available from Philips Semiconductors specifies a maximum DC output offset voltage of 150 mV. This high output offset voltage is believed, in connection with this invention, to be for a likely cause of speaker "popping" on power-up and of increased quiescent current consumption.

BRIEF SUMMARY OF THE INVENTION

It is therefore an object of this invention to provide an audio preamplifier architecture in which input offset voltages are not amplified into the audio output signal.

It is a further object of this invention to provide such an architecture in which the amplifier standby current is minimized, along with reduced turn-on "popping" and a lower noise floor characteristic.

It is a further object of this invention to provide such an architecture that is suitable for use in a class D integrated preamplifier and audio amplifier.

It is a further object of this invention to provide such an architecture in which the output characteristic is highly linear, so that total harmonic distortion is minimized.

Other objects and advantages of this invention will be apparent to those of ordinary skill in the art having reference to the following specification together with its drawings.

The present invention may be implemented into an audio preamplifier circuit utilizing an operational transconductance amplifier (OTA). A feedback loop is incorporated into the OTA preamplifier. The transconductance of the OTA is set by an input resistor in series with a DC blocking capacitor, eliminating the output current due to input offset voltage.

DETAILED DESCRIPTION OF THE INVENTION

The present invention will be described in connection with its preferred embodiment, namely as implemented into an integrated audio amplifier and preamplifier circuit, in a modern system such as an LCD television. However, it is contemplated that the benefits of this invention may also be attained in other applications, particularly those that are sensitive to amplification of offset voltage and noise. Accordingly, it is to be understood that the following description is provided by way of example only, and is not intended to limit the true scope of this invention as claimed.

Figure 1:
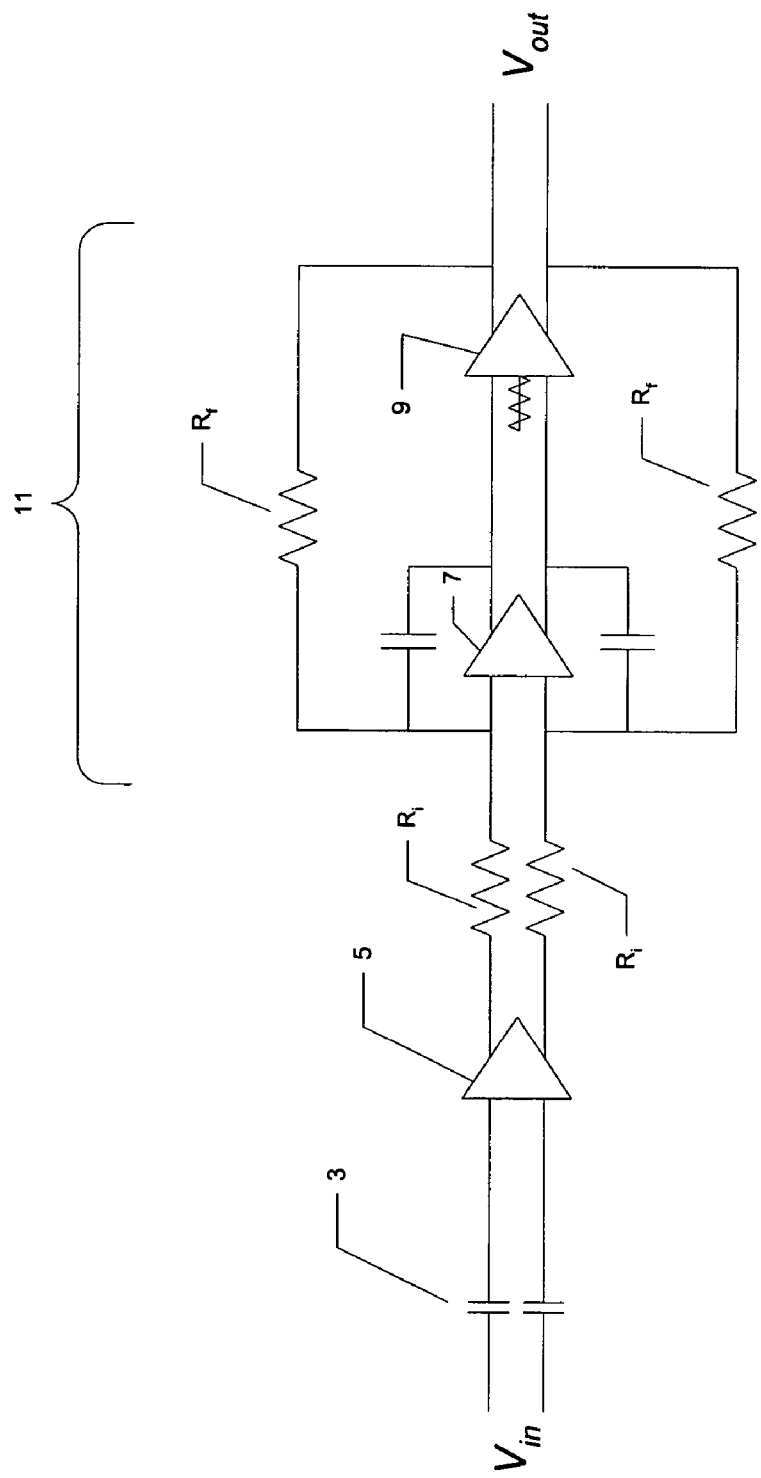
FIG. 1 is an electrical diagram, in schematic form, of a conventional class D audio amplifier and preamplifier architecture.
Figure 2:
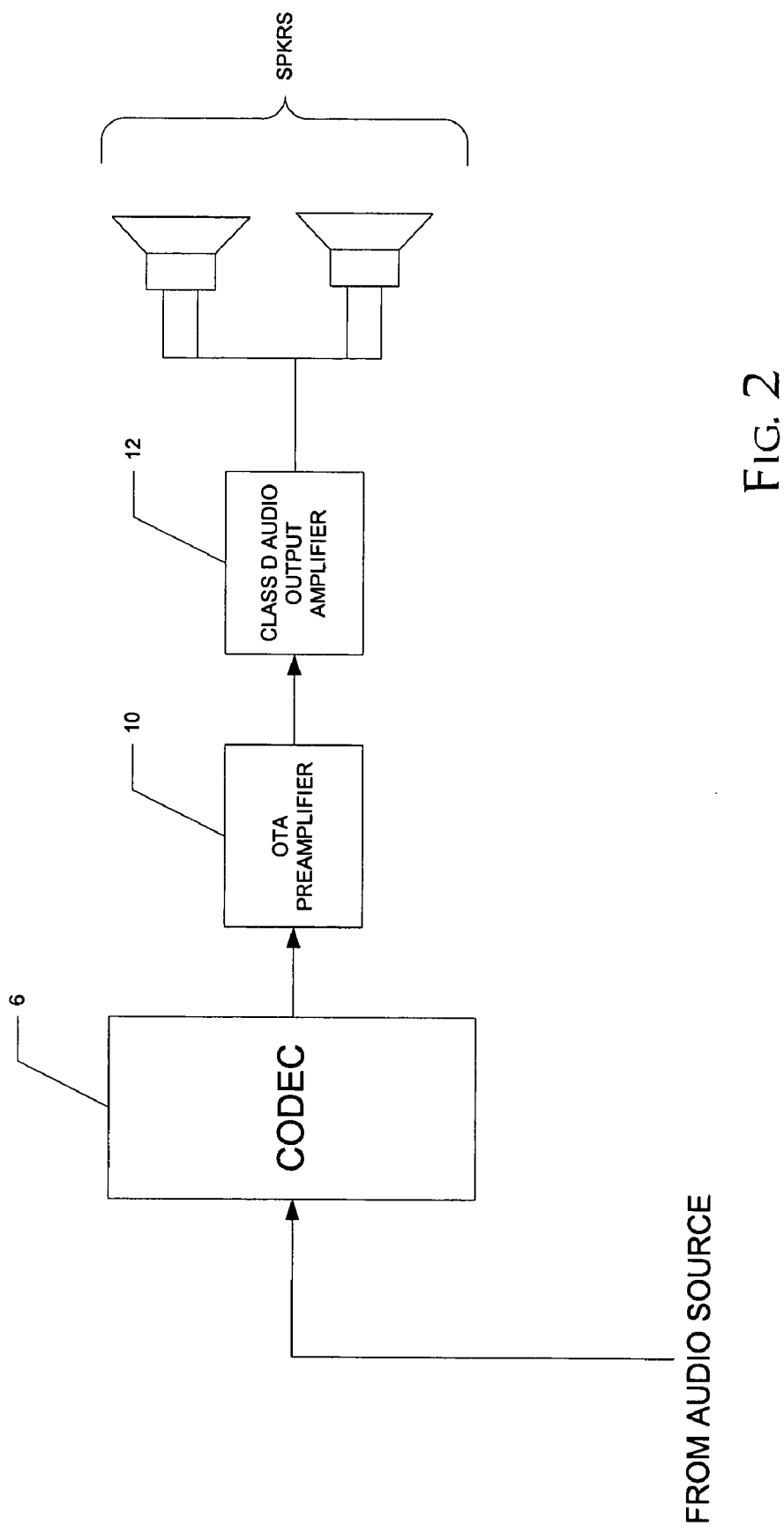
FIG. 2 is an electrical diagram, in block form, of an audio system constructed according to the preferred embodiment of the invention.

FIG. 2 illustrates an audio system into which preamplifier and audio output amplifier circuitry according to the preferred embodiment of the invention may be implemented. The audio system of FIG. 2 may represent a standalone audio system, such as an automobile, portable, or bookshelf sound system, or alternatively may be implemented within an audio-visual system, such as a television set. It is contemplated that this invention is applicable to audio systems in any number of applications, including these types of audio systems, and also other systems having audio output.

In the system of FIG. 2, an audio source provides audio signals to coder/decoder (codec) 6. The audio source may be any one of a number of conventional sources of digital or analog audio information, including compact disc (CD) or digital video disk (DVD) players, a computer forwarding digital audio information such as in the form of MPEG data, sources of analog audio information such as from microphones and musical instrument pickups, or audio signals communicated by conventional broadcast or cable television sources. The audio signal, if in the digital domain, may be also be processed by conventional digital signal processing routines, including filtering and the like, by a digital signal processor (DSP) such as the 320C5x digital signal processors available from Texas Instruments Incorporated. Codec 6 is a conventional codec device, including such functions as analog-to-digital converters (ADCs) and digital-to-analog converters (DACs), oversampling digital interpolation filters, sigma-delta modulators, and the like. An example of a suitable codec 6 is the TLV320AIC23B high-performance stereo audio codec available from Texas Instruments Incorporated.

The output of codec 6 is applied to OTA preamplifier 10, constructed according to the preferred embodiment of the invention as will be described in further detail below. Preferably, these signals are communicated as a real-time differential analog voltage for each audio channel. According to this embodiment of the invention, OTA preamplifier 10 amplifies the codec output, and applies the amplified signal to class D audio output amplifier 12, which in turns drive one or more speakers SPKRS with pulse-width modulated (PWM) rail-to-rail signals. As in the conventional arrangement described above, class D audio output amplifier 12 applies a fixed gain (e.g., a gain of 5) to the output of preamplifier 10. As such, preamplifier 10 is called upon to apply the remainder of the desired gain in the audio output of this system.

Figure 3:
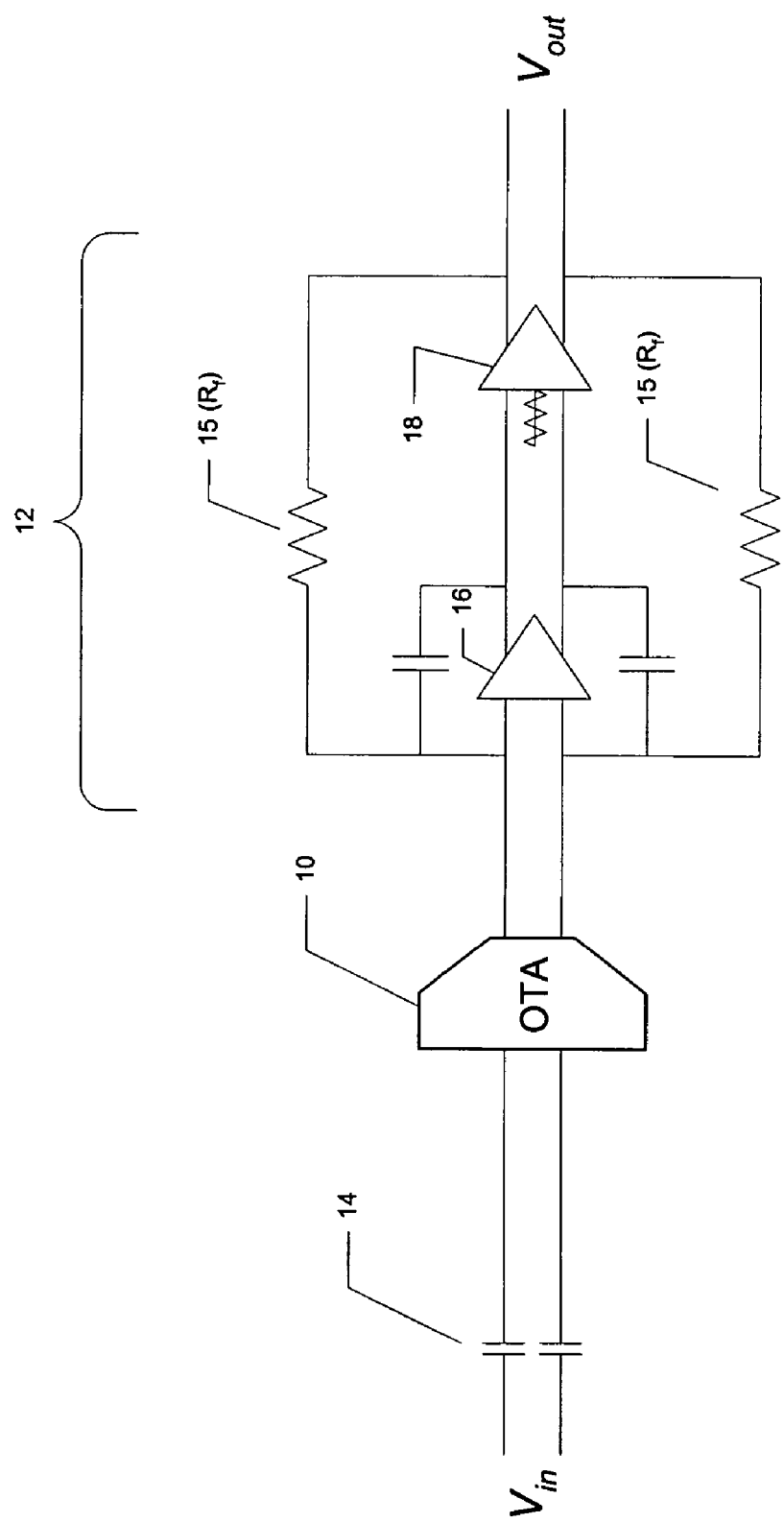
FIG. 3 is an electrical diagram, in schematic form, of a class D audio amplifier and preamplifier architecture constructed according to the preferred embodiment of the invention.

FIG. 3 illustrates the channel gain amplification circuitry of OTA preamplifier 10 and audio power amplifier 12 according to the preferred embodiment of the invention, in further detail. As shown in FIG. 3, differential input voltage $V_{in}$ is capacitively coupled to the differential input of OTA preamplifier 10 by series capacitors 14. OTA preamplifier 10 is a transconductance amplifier, and as such generates an output current in response to the differential voltage at its input, based on a transconductance value $g_m$ that is set by a resistor internal to OTA preamplifier 10, as will be described below. The amplified output current of OTA preamplifier 10 is applied to the differential input of integrating amplifier 16 of audio output amplifier 12 as shown; amplifier 16 is an integrating amplifier, considering its feedback capacitors as shown in FIG. 3. The differential output of integrating amplifier 16 is applied to the differential input of PWM amplifier 18, which chops the analog differential voltage from integrating amplifier 16 and generates a corresponding PWM signal that has the effective voltage $V_{out}$ as shown in FIG. 3. This voltage $V_{out}$ is fed back differentially by way of feedback resistors 15, having resistance $R_f$, to the differential input of integrating amplifier 16.

As mentioned above relative to the Background of the Invention, the amplification of offset voltage by conventional audio preamplifiers is a significant problem. The presence of a DC offset at the output of an audio amplifier causes such problems as "popping" of the speakers when the amplifier is powered up, and increases in the DC bias current at the output audio drive devices, which degrades efficiency. It has been discovered, in connection with this invention, that the use of an OTA preamplifier, such as OTA preamplifier 10 in the system of FIGS. 2 and 3, can reduce the amplification of noise and voltage offset that appears at the input of the audio output amplifier. This reduction in amplification is believed to be primarily due to the high output impedance of the OTA circuit, as compared with conventional operational amplifiers. The output offset current of the OTA preamplifier will contribute to the total offset voltage and is preferably minimized by good matching of the OTA output bias current sources, as will be described below. To the extent that differential offset current is presented, its effect will be mitigated by the PWM chopping by audio output amplifier 12.

It has been discovered, in connection with this invention, that an OTA-based preamplifier can be beneficially used use in an audio system such as that of FIG. 2 if certain requirements are met. A first requirement on OTA preamplifier 10 is that its transconductance must be set by a resistor of the same construction type as the feedback resistors used in class D audio output amplifier 12, and preferably in close proximity to those feedback resistors. This close matching results from the following equation for the total channel gain $A_v$:

$$A_v = \frac{V_{out}}{V_{in}} = \frac{I_{out}}{V_{in}} \cdot \frac{V_{out}}{I_{outOTA}} = \frac{R_f}{R_{gm}} \quad (2)$$

where the currents and voltages $I_{out}$, $I_{in}$, $V_{out}$, $V_{in}$, are self-explanatory, relative to FIG. 3. Current $I_{outOTA}$ refers to the output current of OTA preamplifier 10. Referring to FIG. 3, resistance $R_f$ is the resistance of each feedback resistor 15 of class D audio output amplifier 12, while resistance $R_{gm}$ is the resistance of the resistor in OTA preamplifier 10 that sets its transconductance $g_m$.

Another requirement, as mentioned above, is that OTA preamplifier 10 must not significantly amplify the offset voltage of the signal received at its input. This requirement results from the high channel gain $A_v$ that is applied to the signal path (typically $10 < A_v < 63$) by the combination of OTA preamplifier 10 and audio output amplifier 12. As will be apparent from the following description, the input offset voltage of the OTA preamplifier is prevented from being converted to an output offset voltage by the use of input blocking capacitors, which prevents DC current flow through transconductance resistors. For similar reasons, the output offset current must be minimized. To the extent that differential offset current is present, this current will be chopped, so its effect is mitigated.

Another requirement of OTA preamplifier 10 is that it must be highly linear over a large input signal swing. This linearity is necessitated by the fixed gain of audio output amplifier 12, which constrains the linearity of OTA preamplifier 10 so that harmonic distortion and other deleterious effects are minimized.

Figure 4:
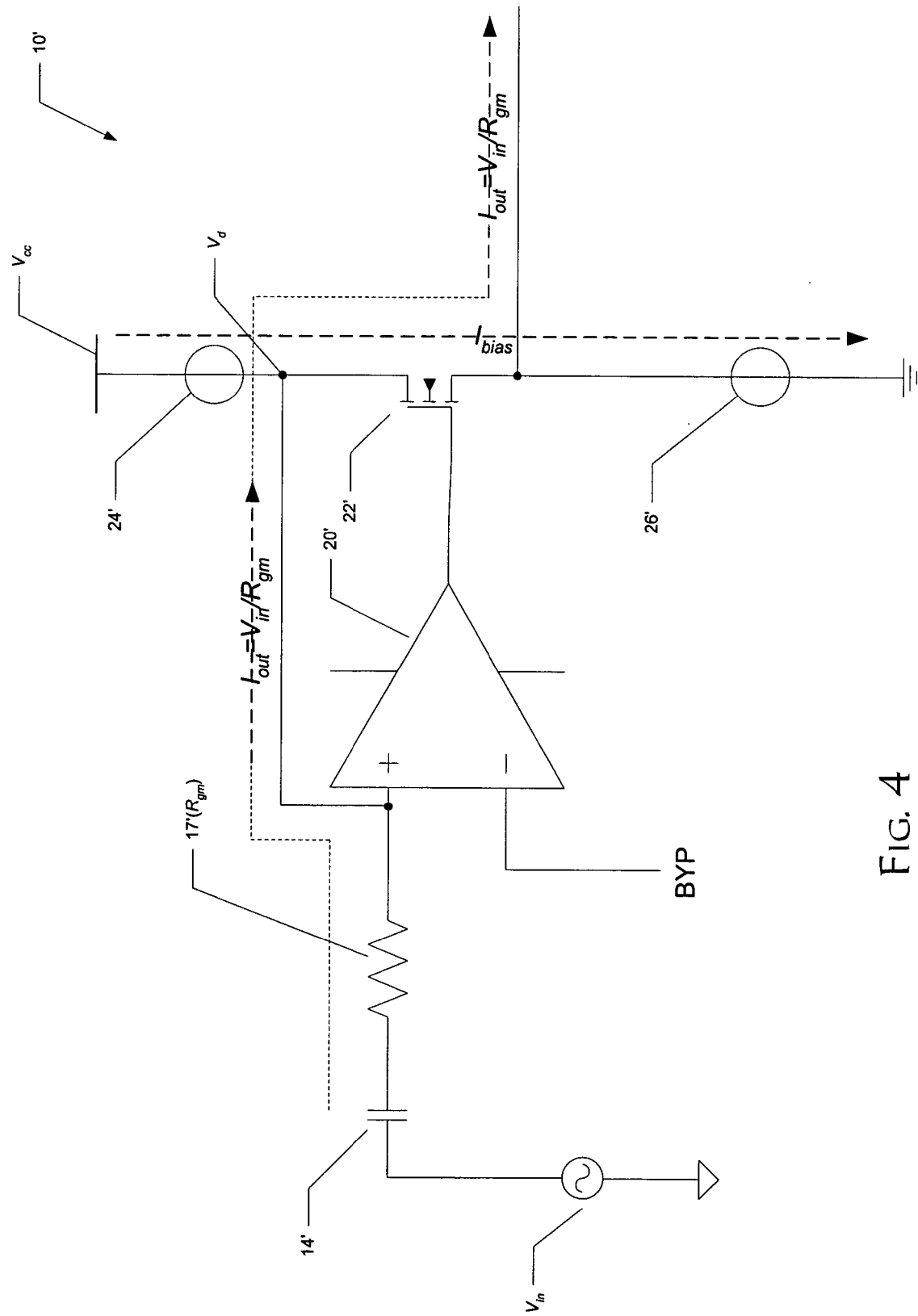
FIG. 4 is an electrical diagram, in schematic form, of a single-ended operational transconductance amplifier (OTA) illustrating the theory of operation of the preamplifer according to the preferred embodiment of the invention.

Referring now to FIG. 4, the theory of operation of OTA preamplifier 10 according to the preferred embodiment of the invention will now be described, with reference to a single-ended OTA circuit 10'. In this model, operational amplifier 20' receives a reference voltage BYP at its inverting input. Reference voltage BYP is a stable voltage, such as one-half the power supply bias voltage, or may be a bandgap voltage or another regulated reference voltage. The non-inverting input to operational amplifier 20' is based on input voltage $V_{in}$, which is capacitively coupled to operational amplifier 20' via capacitor 14', and applied through resistor 17', which has a resistance $R_{gm}$. The output of operational amplifier 20' is connected to the gate of n-channel MOS output drive transistor 22'. The drain of transistor 22 receives a bias current $I_{bias}$ from current source 24' that is biased to power supply voltage $V_{cc}$ and the source of transistor 22' conducts bias current $I_{bias}$ through current source 26' to ground, and also presents the output of OTA circuit 10' as output current $I_{out}$. The drain of transistor 22' is connected to the non-inverting input of operational amplifier 20', in the feedback loop of OTA circuit 10'.

In operation, a positive input voltage $V_{in}$ that is coupled to resistor 17' through capacitor 14' causes the output of operational amplifier 20' to rise, turning on transistor 22' until the drain voltage $V_d$ of transistor 22' falls to the level of reference voltage BYP. Because of the high input impedance of operational amplifier 20', the output current $I_{out}$ driven through transistor 22' is therefore the non-DC component of input voltage $V_{in}$ divided by the resistance $R_{gm}$ of resistor 17'. This series connection of resistor 17' with capacitor 14' therefore ensures that any DC offset current component of output current $I_{out}$ due to DC offset in input voltage $V_{in}$ is due only to the output impedance of drain current source 24'. This output impedance can be made quite high, and thus this circuit can readily meet the requirement that the offset voltage of the input signal must not be amplified.

To the extent that output offset current is driven by OTA circuit 10', the primary component of this current is due to mismatch between the output impedances of drain current source 24' and source current source 26'. However, because current sources 24', 26' can be fabricated on the same integrated circuit and in close proximity to one another, it is contemplated that this mismatch can be very small. For example, assuming a relatively high voltage $V_{GST}$ (which is about 500 mV) and the realization of current sources 24', 26' in moderate chip area, it is contemplated that the mismatch can be held below about 0.5%, which will provide very low output offset current.

Further, resistor 17' can be realized of the same material and in close proximity to feedback resistors 15 of output audio amplifier 12 (FIG. 3). Accordingly, the requirement giving rise to equation (2) above can be readily met.

The linearity of OTA circuit 10' is also contemplated to be quite good over a large input voltage swing. This linearity is established by the feedback loop between the drain of transistor 22' and the non-inverting input of operational amplifier 20', which precisely controls the current through resistor 17'. The only current that is not controlled by the feedback loop is the current $I_{bias}$ conducted by current sources 24', 26'. It is contemplated that non-linearity in this current $I_{bias}$ can be minimized by realizing current sources 24', 26' by relatively large channel length, closely-matched, devices, and by the stability in the source and drain voltages of transistor 22'. Drain voltage $V_d$ will be held constant by the feedback loop, while the voltage at the source of transistor 22' (i.e., the output voltage of the circuit) will be held constant by the feedback loop of the downstream audio output amplifier 12 (FIG. 3). Accordingly, it is believed that a circuit based on OTA circuit 10' of FIG. 4 can meet the requirements mentioned above for a suitable OTA-based preamplifier.

Figure 5:
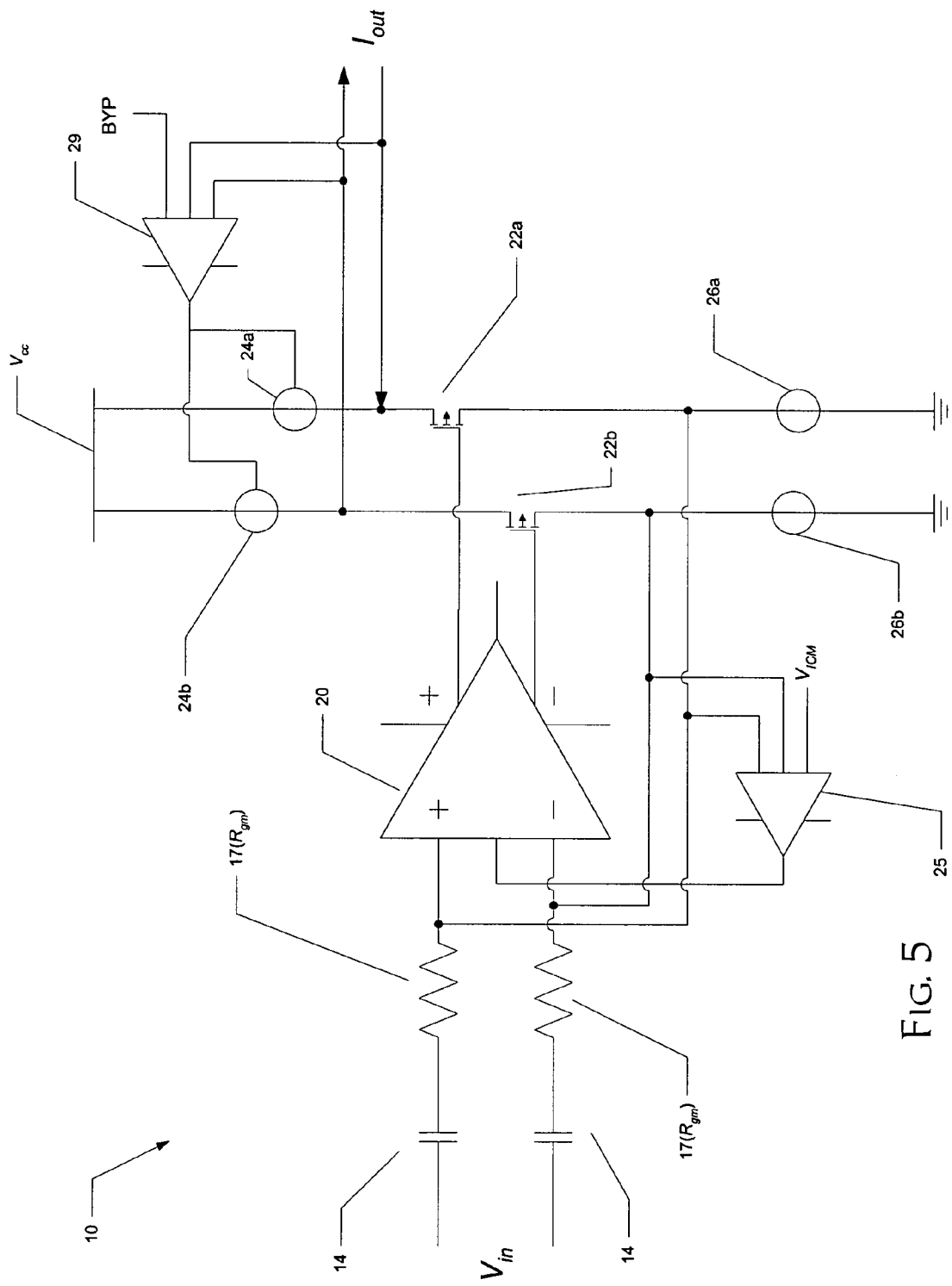
FIG. 5 is an electrical diagram, in schematic form, of a differential OTA as incorporated into the preamplifier architecture of FIG. 3 according to the preferred embodiment of the invention.

Referring now to FIG. 5, the construction of OTA preamplifier 10 suitable for use in the audio channel amplification arrangement of FIG. 3, according to the preferred embodiment of the invention, will now be described in detail. OTA amplifier 10 of FIG. 5 is arranged as a differential amplifier, as required by this implementation, but operates according to the theory of operation described above relative to OTA circuit 10' of FIG. 4.

In summary, OTA preamplifier 10 according to this embodiment of the invention is implemented in a fully differential form, consistent with the audio channel amplification application. As such, OTA preamplifier 10 is based on differential operational amplifier 20, which receives a differential input signal and generates a differential output signal. The differential output signal controls a pair of transistors 22a, 22b generating a differential output current $I_{out}$ that is forwarded to audio output amplifier 12 (FIG. 3). In this preferred embodiment of the invention, a pair of common mode feedback circuits are provided, one to control amplifier 20, and the other to control the common mode voltage of audio output amplifier 12, as will be described below.

In detail, input voltage $V_{in}$ is applied as a differential signal to a pair of coupling capacitors 14, each in series with a corresponding resistor 17 (each having a resistance of $R_{gm}$) and one of the differential inputs to amplifier 20. It is contemplated that the resistance $R_{gm}$ may vary from several kΩ to tens of kΩ, for channel gains of on the order of 10 to 63 (and assuming a fixed gain of 5 applied by audio output amplifier 12). The positive and negative differential outputs of amplifier 20 are connected to the gate of respective p-channel MOS transistors 22a, 22b. The sources of transistors 22a, 22b are biased to power supply voltage $V_{cc}$ through respective current sources 24a, 24b, and the drains of transistors 22a, 22b are coupled to ground through respective current sources 26a, 26b. The output differential current $I_{out}$ is driven from the sources of transistors 22a, 22b.

Consistent with the example of FIG. 4, a feedback connection is made from the drain of transistor 22a to the non-inverting input of amplifier 20; similarly, the drain of transistor 22b is connected to the inverting input of amplifier 20.

The differential arrangement of OTA preamplifier 10 according to this preferred embodiment of the invention meets the requirements discussed above, in similar fashion as described above in the illustrative case of OTA circuit 10' of FIG. 4. First, resistors 17 are connected in series with respective ones of capacitors 14, and ensure that there is no DC offset current component in output current $I_{out}$ derived from DC offset in the input voltage $V_{in}$, except for that resulting from the output impedance of current sources 24a, 24b, which can be kept quite high. As a result, any offset voltage in the input signal $V_{in}$ is not amplified by OTA preamplifier 10. Also, transconductance resistors 17 can again be constructed in the same manner as, and in close proximity to, feedback resistors 15 in audio output amplifier 12, as mentioned above. Preferably, OTA preamplifier 10 and audio output amplifier 12 are realized in the same integrated circuit, with resistors 17 and 15 disposed in close proximity with one another and fabricated from the same material (e.g., of polysilicon elements of the same sheet resistance, and in the same conductor level).

Further, mismatch in the output impedances of current sources 24a, 26a, and current sources 24b, 26b, can similarly be minimized as discussed above. The offset current component in output current $I_{out}$ is therefore minimized according to this preferred embodiment of the invention.

The linearity of OTA preamplifier 10 according to this preferred embodiment of the invention is also contemplated to be excellent over a wide input signal swing. This linearity results from the feedback of the drain voltages at transistors 22a, 22b, which control the current through resistors 17. The current outside of this feedback loop is only the bias current conducted by current sources 24, 26, non-linearities in which can be closely controlled by realizing current sources 24, 26 as closely-matched devices with long channel length. Control of the source voltages of transistors 22a, 22b is also important in ensuring excellent linearity, and is attained by common mode feedback control provided by amplifiers 25, 29, as will now be described.

Figure 6:
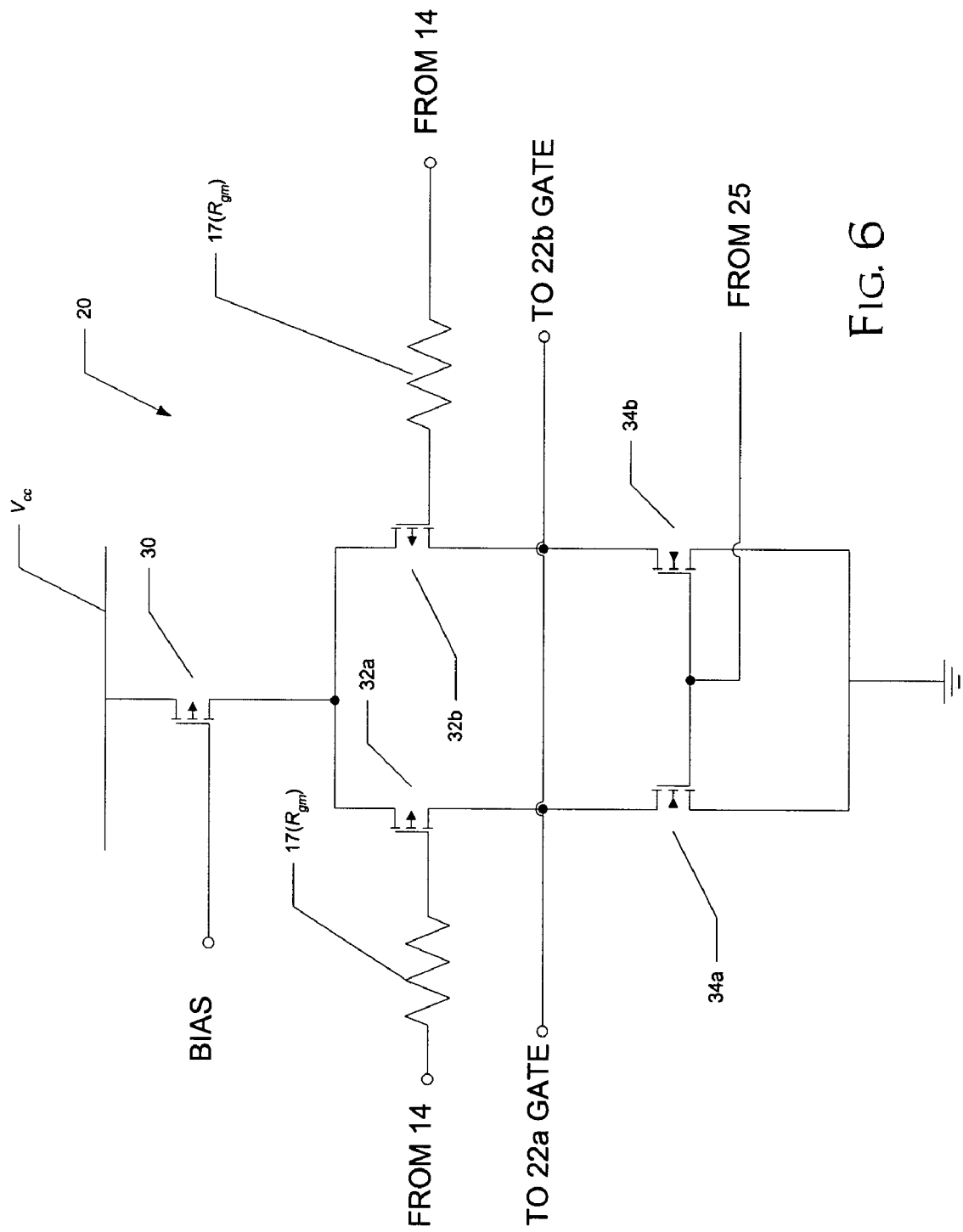
FIG. 6 is an electrical diagram, in schematic form, illustrating the construction of the differential amplifier used in the OTA of FIG. 5, according to the preferred embodiment of the invention.

As shown in FIG. 5, amplifier 25 receives the drain voltages from transistors 22a, 22b at its inputs, along with a reference voltage $V_{ICM}$. The output of amplifier 25 is applied to differential operational amplifier 20 to control its operation so that p-channel transistors 22a, 22b, and also current sources 26a, 26b, remain in the saturation region. Referring to FIG. 6, an example of the construction of amplifier 20 and its control by amplifier 25 will now be described.

In this example, amplifier 20 is constructed from complementary MOS (CMOS) transistors. In one leg, p-channel MOS transistor 32a has its source-drain path connected in series with the source-drain path of n-channel MOS transistor 34a; in the other leg, p-channel MOS transistor 32b has its source-drain path connected in series with the source-drain path of n-channel MOS transistor 34b. The sources of n-channel transistors 34a, 34b are connected together and to ground. The sources of p-channel transistors 32a, 32b are connected together and to the drain of p-channel MOS bias transistor 30, which has its source biased to power supply voltage $V_{cc}$ and its gate biased by voltage BIAS, which may be divided down from power supply voltage $V_{cc}$ or generated by a bandgap reference or other voltage reference circuit. The gates of p-channel transistors 32a, 32b are connected to respective resistors 17, and as such the capacitively-coupled differential input voltage $V_{in}$ is developed across these gate nodes. The common drain node of transistors 32a, 34a is connected to the gate of p-channel transistor 22a, and the common drain node of transistors 32b, 34b is connected to the gate of p-channel transistor 22b.

Referring to FIGS. 5 and 6 in combination, the gates of transistors 34a, 34b are connected together, and receive the output of amplifier 25. Transistors 34a, 34b control the conduction through the legs of differential amplifier 20, as evident from FIG. 6, and as such control the voltage to which the output nodes at the drains of transistor pairs 32a, 34a; 32b, 34b is biased. The voltage at these output nodes of course determine the steady-state gate bias of transistors 22a, 22b. In turn, the bias of transistors 22a, 22b affects the bias of current sources 26a, 26b. According to the preferred embodiment of the invention, transistors 22a, 22b and current sources 26a, 26b are each biased in the saturation region so that the current conducted is controlled by their gate voltage (for MOS devices).

Referring back to FIG. 5, the output of amplifier 25 depends on the difference between a reference voltage $V_{ICM}$ and the common mode voltage at the drains of transistors 22a, 22b. The voltage $V_{ICM}$ is thus set to a voltage that corresponds to the desired steady-state saturating drain voltage for transistors 22a, 22b and for current sources 26a, 26b. For example, a desired common-mode voltage into class D audio output amplifier 12 of about 1.65 volts can be achieved with a reference voltage $V_{ICM}$ of about 1.2 volts.

Amplifier 29 controls the bias to current sources 24a, 24b in response to the common mode voltage at the output of OTA preamplifier 10, as forwarded to the inputs of integrating amplifier 16 of audio output amplifier 12. For example, if current sources 24a, 24b are realized by MOS transistors, the output of amplifier 29 controls the gate voltage applied to these devices, and thus the current conducted thereby. Amplifier 29 receives, along with the voltage at the sources of transistors 22a, 22b, bias voltage BYP. As before, bias voltage BYP may be divided down from a power supply voltage (e.g., power supply voltage $V_{cc}$) or alternatively may be a bandgap reference voltage or another stable regulated voltage. Current sources 26a, 26b are preferably biased, by a fixed bias voltage, to conduct a "sink" current that is slightly higher than that required to drive the outputs of audio output amplifier 12 (FIG. 3) rail to rail. This current is contemplated to be about equal to power supply voltage $V_{cc}$ less bias voltage BYP, divided by the resistance $R_f$ of feedback resistors 15. Amplifier 29 preferably regulates the "source" current provided by current sources 24a, 24b accordingly, in response to the common mode voltage at the output of OTA preamplifier 10 and thus at the input to integrating amplifier 16.

In addition, the action of amplifier 25 in regulating the common mode voltage at the input of differential amplifier 20, as described above, permits OTA preamplifier 10 to provide active level shifting from the regulated voltage (e.g., a voltage lower than the high power output supply) to power supply voltage $V_{cc}$. In addition, OTA preamplifier 10 can also effect a single-ended to differential conversion if the input signal $V_{in}$ is single-ended, rather than a differential signal as described above, by virtue of the operation of the output common mode regulator circuit.

Referring back to FIG. 3, in operation, integrating amplifier 16 receives the differential signal corresponding to output current $I_{out}$ from OTA preamplifier 10. This differential signal is integrated and amplified in the conventional manner, and applied as a differential signal to the input of PWM amplifier 18. A reference waveform is applied to PWM amplifier 18 to define the frequency of the output class D PWM output signal. The output of amplifier 18 is a rail-to-rail class D signal that corresponds to the real-time result of the comparison between the input differential voltage, which is relatively steady relative to the PWM frequency, and the PWM reference waveform. This output signal is then applied to audio speakers, in this application, for generation of the audible output corresponding to the input signal applied to OTA preamplifier 10.

It is contemplated that the construction and implementation of an OTA preamplifier according to this invention will provide numerous advantages over conventional circuits. An important advantage is the significant reduction in output offset voltage provided by the OTA preamplifier according to this invention. As mentioned above, conventional OTA preamplifiers typically have an output offset voltage specification of on the order of 150 mV. It is contemplated, based on simulations, that the output offset voltage of the OTA preamplifier according to the preferred embodiment of the invention will be less than about 20 mV, nearly an order of magnitude better than conventional circuits. The output offset current is contemplated to also be very low, on the order of 160 nA. This excellent offset performance is believed to be due to the offset blocking provided by the input coupling capacitors in series with the transconductance-defining resistors. This offset cancellation is especially important in modern audio systems, especially those in which power consumption is to be minimized.

In addition, excellent linearity in the output response of the audio channel amplified using the OTA preamplifier of this invention will result. This linearity is contemplated to be due to the feedback-enclosed output current, including its control by the common mode output voltage. Further, the circuit of this invention provides the versatility of a fully differential architecture in a transconductance environment, without sacrificing the offset blocking and linearity benefits traditionally provided by voltage-to-voltage preamplifiers.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A preamplifier circuit, comprising:
   a differential operational amplifier, for presenting a differential signal at first and second outputs responsive to a differential signal at first and second inputs;
   first and second resistors, connected to the first and second inputs of the differential operational amplifier, respectively;
   a first output transistor, having a gate coupled to the first output of the differential operational amplifier, and having a source/drain path;
   a second output transistor, having a gate coupled to the second output of the differential operational amplifier, and having a source/drain path;
   first bias current circuitry connected in series with the source/drain path of the first output transistor;
   second bias current circuitry connected in series with the source/drain path of the second output transistor;
   a first feedback path connected between the drain of the first output transistor and the first input of the differential operational amplifier; and
   a second feedback path connected between the drain of the second output transistor and the second input of the differential operational amplifier.

2. The preamplifier circuit of claim 1, further comprising:
   first and second capacitors, connected in series with the first and second resistors, respectively.

3. The preamplifier circuit of claim 1, wherein the first bias current circuitry comprises:
   a first source current source connected between a power supply voltage and the source/drain path of the first output transistor; and
   a first sink current source connected between a reference voltage and the source/drain path of the first output transistor.

4. The preamplifier circuit of claim 3, wherein the second bias current circuitry comprises:
   a second source current source connected between a power supply voltage and the source/drain path of the first output transistor; and
   a second sink current source connected between a reference voltage and the source/drain path of the first output transistor.

5. The preamplifier circuit of claim 4, further comprising:
   an output common-mode feedback control circuit, having inputs connected to the sources of the first and second output transistors, having an input receiving a reference voltage, and having an output coupled to control terminals of the first and second source current sources.

6. The preamplifier circuit of claim 5, further comprising:
   an input common-mode feedback control circuit, having inputs connected to the drains of the first and second output transistors, having an input receiving a common-mode reference voltage, and having an output coupled to a control terminal of the differential operational amplifier.

7. The preamplifier circuit of claim 1, further comprising:
   an input common-mode feedback control circuit, having inputs connected to the drains of the first and second output transistors, having an input receiving a common-mode reference voltage, and having an output coupled to a control terminal of the differential operational amplifier.

8. The preamplifier circuit of claim 1, wherein each of the first and second output transistors is a p-channel MOS transistor.

9. A class D audio amplifier, comprising:
   an operational transconductance preamplifier, having first and second inputs and first and second outputs;
   first and second resistors, connected to first and second inputs of the operational transconductance preamplifier, for receiving a capacitively coupled input signal; and
   an audio output amplifier, comprising:
   an integrating amplifier, having inputs coupled to the first and second outputs of the operational transconductance preamplifier;
   a pulse-width modulating amplifier, having inputs coupled to outputs of the integrating amplifier, for generating a pulse-width modulated output signal; and
   first and second feedback resistors, each connected between an output of the pulse-width modulating amplifier and an input of the integrating amplifier,
   wherein the operational transconductance preamplifier comprises:
   a differential operational amplifier, for presenting a differential signal at first and second outputs responsive to a differential signal at first and second inputs;
   a first output transistor, having a gate coupled to the first output of the differential operational amplifier, and having a source/drain path;
   a second output transistor, having a gate coupled to the second output of the differential operational amplifier, and having a source/drain path;
   first bias current circuitry connected in series with the source/drain path of the first output transistor;
   second bias current circuitry connected in series with the source/drain path of the second output transistor;
   a first feedback path connected between the drain of the first output transistor and the first input of the differential operational amplifier; and
   a second feedback path connected between the drain of the second output transistor and the second input of the differential operational amplifier;
   wherein the first and second outputs of the operational transconductance preamplifier are at drains of the first and second output transistors.

10. The amplifier of claim 9, wherein the first bias current circuitry comprises:
    a first source current source connected between a power supply voltage and the source/drain path of the first output transistor; and
    a first sink current source connected between a reference voltage and the source/drain path of the first output transistor.

11. The amplifier of claim 10, wherein the second bias current circuitry comprises:
    a second source current source connected between a power supply voltage and the source/drain path of the first output transistor; and
    a second sink current source connected between a reference voltage and the source/drain path of the first output transistor.

12. The amplifier circuit of claim 11, further comprising:
    an output common-mode feedback control circuit, having inputs connected to the sources of the first and second output transistors, having an input receiving a reference voltage, and having an output coupled to control terminals of the first and second source current sources.

13. The amplifier of claim 12, further comprising:
    an input common-mode feedback control circuit, having inputs connected to the drains of the first and second output transistors, having an input receiving a common-mode reference voltage, and having an output coupled to a control terminal of the differential operational amplifier.

14. The amplifier of claim 9, further comprising:
    an input common-mode feedback control circuit, having inputs connected to the drains of the first and second output transistors, having an input receiving a common-mode reference voltage, and having an output coupled to a control terminal of the differential operational amplifier.

15. The amplifier of claim 9, wherein each of the first and second output transistors is a p-channel MOS transistor.

16. A method of amplifying a signal in an audio channel, comprising the steps of:
    coupling an input signal through a capacitor in series with a resistor, to an input of an operational transconductance amplifier;
    conducting a bias current through the source/drain path of at least one output MOS transistor;
    operating the operational transconductance amplifier to drive the gate of the at least one output MOS transistor responsive to the coupled input signal, to generate an output current;
    coupling a drain voltage from the at least one output MOS transistor as feedback to at least one input of the operational transconductance amplifier;
    applying the output current to at least one input of an integrating amplifier;
    applying the output of the integrating amplifier to a pulse-width modulating amplifier to generate a pulse-width modulated output signal.

17. The method of claim 16, wherein the input signal is a differential input signal;

wherein the operational transconductance amplifier comprises a differential operational amplifier having first and second inputs;

wherein the step of coupling the input signal couples the differential input signal through a capacitor in series with a resistor to each of the first and second inputs of the differential operational amplifier;

and wherein the at least one output MOS transistor comprises first and second output MOS transistors.

18. The method of claim 16, wherein the step of coupling the drain voltage comprises coupling the drain voltage from the first and second output MOS transistors as feedback to the first and second inputs of the differential operational amplifier, respectively;

and further comprising:

generating a gain control signal responsive to a reference voltage and a common mode voltage of the drain voltages from the first and second output MOS transistors; and applying the gain control signal to the differential operational amplifier.

19. The method of claim 17, wherein the step of conducting a bias current comprises:

conducting a controlled current through a first source current source into the source/drain path of the first output MOS transistor;

conducting a controlled current through a first sink current source from the source/drain path of the first output MOS transistor;

conducting a controlled current through a second source current source into the source/drain path of the second output MOS transistor; and conducting a controlled current through a second sink current source from the source/drain path of the second output MOS transistor.

20. The method of claim 19, further comprising:

generating a current control signal responsive to a reference voltage and a common mode voltage of source voltages from the first and second output MOS transistors; and controlling the first and second source current sources responsive to the current control signal.

21. The method of claim 16, further comprising:

coupling the pulse-width modulated output signal as feedback to the least one input of the integrating amplifier, through at least one resistor.

* * * * *